(12) United States Patent
Cha

(10) Patent No.: US 6,924,556 B2
(45) Date of Patent: Aug. 2, 2005

(54) STACK PACKAGE AND MANUFACTURING METHOD THEREOF

(75) Inventor: Ki Bon Cha, Cheongju-Shi (KR)

(73) Assignee: Unisemicon Co., Ltd., Kyeongki-Do (KR)

( * ) Notice: Subject to any disclaimer, the term of this patent is extended or adjusted under 35 U.S.C. 154(b) by 218 days.

(21) Appl. No.: 10/279,977

(22) Filed: Oct. 25, 2002

(65) Prior Publication Data

US 2004/0046005 A1 Mar. 11, 2004

(51) Int. Cl.$^7$ ............................................... H01L 29/40
(52) U.S. Cl. ........................................ 257/777; 257/723
(58) Field of Search ................................ 257/777, 723, 257/778, 693, 697

(56) References Cited

U.S. PATENT DOCUMENTS

| | | |
|---|---|---|
| 6,404,043 B1 | 6/2002 | Isaak |
| 6,437,433 B1 | 8/2002 | Ross |
| 6,566,746 B2 | 5/2003 | Isaak et al. |
| 6,576,992 B1 * | 6/2003 | Cady et al. ............... 257/686 |
| 6,577,013 B1 * | 6/2003 | Glenn et al. ............... 257/777 |
| 6,762,487 B2 | 7/2004 | Moshayedi |
| 2004/0046005 A1 | 3/2004 | Cha |

* cited by examiner

Primary Examiner—Roy Potter
(74) Attorney, Agent, or Firm—Jean C. Edwards, Esq.; Dickinson Wright PLLC

(57) ABSTRACT

Disclosed are a stack package and a method of manufacturing the same, which has improved electrical properties by virtue of a reduced signal line length, and also allows reduction of production costs of the stack package. The stack package of the present invention includes panels having an area for mounting respective CSP packages and pin-shaped connectors. The panels include circuit patterns for electrical connection to the CSP packages, which are formed at portions of the panels corresponding to the CSP packages to be mounted. Also, the panels have first openings for electrical connection to the circuit patterns, which are formed at both sides of the circuit patterns. The pin-shaped connectors are inserted through the first openings of the panels. The panels are stacked in at least two layers in such a manner that the first openings of one panel correspond to the first openings of the other panels, so that the connectors are electrically connected to the circuit patterns of the stacked panels.

22 Claims, 12 Drawing Sheets

FIG. 5a  FIG. 5b  FIG. 5c
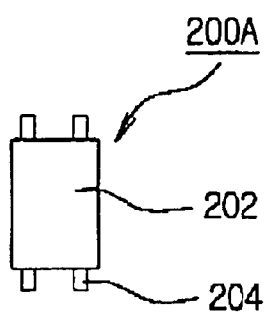
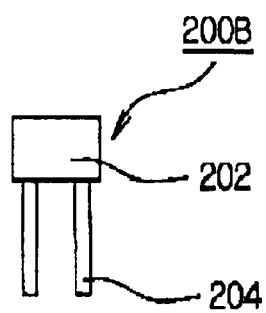
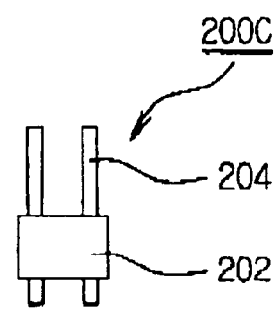
FIG. 6
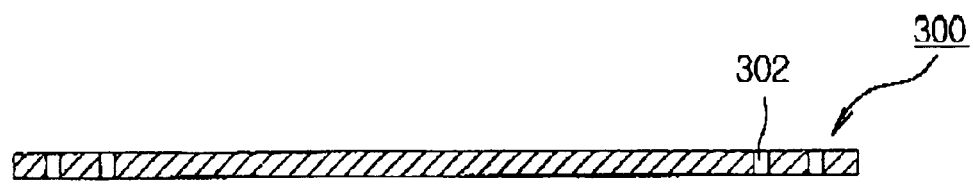

STACK PACKAGE AND MANUFACTURING METHOD THEREOF

BACKGROUND OF THE INVENTION

1. Field of the Invention

The present invention relates in general to a stack package and a method for manufacturing the same, which utilizes a Fine-Pitch Ball Grid Semiconductor Package (hereinafter, refereed to as FBGA package). More particularly, the stack package of the present invention has a reduced signal line length and thus an improved electrical property.

2. Background of the Related Art

Generally, semiconductor devices and package technologies thereof have continued to develop with mutual coincidence for high density, high speed, small size and thin thickness. Particularly, package structures have been rapidly advanced from pin insertion type to surface mount type, so that their mounting density in a circuit substrate is increased.

Recently, Chip Scale Packages (hereinafter, referred to as CSP packages) were developed, which maintain properties of a bare chip in a package state intact, are also easy to handle, and have a reduced package size.

Among such various CSP packages, an FBGA package as shown in FIG. 1 currently attracts the highest attention. FIG. 1 is a drawing which shows the general structure of the FBGA package. As shown in FIG. 1, this FBGA package PKG comprises a semiconductor chip 1 on which an electronic circuit is integrated; a circuit substrate 2 for transmitting a signal from the semiconductor chip 1 to the outside; wires 3 for electrically connecting the semiconductor chip 1 to the circuit substrate 2; a molded insulation of resin 5 serving to protect the wires 3; and first solder balls 4 fused to the lower surface of the circuit substrate and serving to output/output a signal from the semiconductor chip 1 to the outside.

Recently, a stack package whose capacity and mounting density are increased by the use of the FBGA package as described above have attracted the attention. Such a stack package comprises unit packages where several unit packages which were individually assembled are stacked on top of each other, unlike a stacked chip package where several unpackaged semiconductor devices are stacked on top of each other. Examples of the stack package according to the prior art are shown in FIGS. 2 and 3.

FIG. 2 is a drawing showing an example of the prior stack package. FIG. 2 shows a stack package which utilizes a Flexible Printed Circuit (FPC) made of a polyimide-based film. This stack package comprises a first package 10A, a second package 10B, and multi-layer films 12 for connecting a signal from the first and second packages 10A and 10B. On the lower surface of the films 12, solder balls 14 are mounted, which serve to transmit a signal to the outside. In this case, all the first and second packages 10A and 10B are the same as the FBGA package shown in FIG. 1.

In a method for manufacturing the stack package as shown in FIG. 2, the second package 10B is attached on the multi-layer films 12, and then subjected to an underfill process so as to fix the solder balls 14 mounted on the second package 10B. Next, both the films 12 are attached on the upper surface of the second package 10B with an adhesive, after which the first package 10A is mounted on the films 12.

However, this stack package has a reliability problem caused by a bonding problem between the polyimide films 12 and the first and second packages 10A and 10B. Furthermore, it is disadvantageous in that, since the polyimide films 12 are assembled in two pieces, processing on assembly is difficult, thereby increasing production costs.

FIG. 3 is a drawing showing another example of the prior stack package. FIG. 3 shows a stack package utilizing a printed circuit board (PCB). This stack package comprises a first package 20A, a second package 20B, a first printed circuit board 22A for connecting a signal from the first package 20A, and a second printed circuit board 22B for connecting a signal from the second package 20B. Also, this package comprises a third printed circuit board 22C which is disposed between the first and second printed circuit boards 22A and 22B so as to connect a signal from the first and second printed circuit boards 22A and 22B. Furthermore, the package has solder balls 24 which are mounted on the lower surface of the second printed circuit board 22B so as to transmit a signal to the outside. In this case, the first and second packages 20A and 20B are also the same as the FBGA package shown in FIG. 1.

In a method of manufacturing the stack package as shown in FIG. 3, the second package 22B is first mounted on the upper surface of the second printed circuit board 22B, and then subjected to an underfill process so as to fix the solder balls. Next, the third printed circuit board 22C are mounted on the second package 22B in such a manner that it can be connected to a signal from the upper parts. Thereafter, the first package 20A mounted on the second printed circuit board 22A is mounted on the resulting structure. On the lower surface of the second printed circuit board 22B, the solder balls 24 are mounted which serve to transmit a signal to the outside.

However, this stack package has problems in that additional costs are spent due to the first, second and third printed circuit boards 22A, 22B and 22C, and also the total height of the package is increased. In addition, it is disadvantageous in that, since the third printed circuit board 22C is disposed in the outside of the first and second printed circuit boards 22A and 22B, the size of the final package is increased.

As a result, this stack package undergoes complex operation processes, and also has a large package structure and a long line length for connecting an electrical signal. Furthermore, in the case of the second package, it causes a problem in terms of heat emission, such that it is difficult to use for high-speed applications.

SUMMARY OF THE INVENTION

An object of the present invention is to provide a stack package and a method for manufacturing the same, which comprises panels having circuit patterns formed thereon and connectors having connection pins for stacking the panels on each other, so that it is easily manufactured with a reduced production cost, and has a reduced signal line length and thus an improved electrical property.

To achieve this object, the present invention provides a stack package having CSP packages stacked on each other, in which the CSP packages comprise a substrate for mounting a semiconductor chip, in which the substrate has first solder balls for inputting/outputting a signal from the semiconductor chip, and a mold for protecting the semiconductor chip, the improvement comprising: panels having an area for mounting the respective CSP packages, in which the panels comprise circuit patterns for electrical connection to the CSP packages, which are formed at portions of the panels corresponding to the CSP packages to be mounted, and the panels have first openings for electrical connection to the circuit patterns, which are formed at both sides of the circuit patterns; and pin-shaped connectors which are inserted through the first openings of the panels which are stacked in at least two layers in such a manner that the first openings of one panel correspond to the first openings of the other panels, so that the connectors are electrically connected to the circuit patterns of the stacked panels.

Preferably, the stack package of the present invention may further comprise input/output means for inputting/outputting a signal from the semiconductor chip, in which the input/output means are formed on the lower surface of the stack package.

The input/output means are preferably second solder balls which are formed on the lower surface of the panels so as to be connected to the circuit patterns.

Also, the input/output means may be protrusions protruding from the lower surface of the pin-shaped connectors, in which the protrusions are subjected to a solder dipping process.

The inventive stack package may further comprise second openings which are formed at the surface of the panel corresponding to the first solder balls, such that the first solder balls are inserted into the second openings.

Also, the inventive stack package may further comprises a third opening which is formed at the surface of the panel corresponding to the mold, such that the mold is inserted into the third opening.

Moreover, the inventive stack package may further comprise bonding pads which are formed at the surface of the panel corresponding to the first solder balls, such that the bonding pads are connected to the circuit patterns of the panels.

Such bonding pads comprise signal lines disposed so as to be connected to the circuit patterns via through-holes of the panel, and watertight films which water-tightly seal the through-holes in which the signal lines are disposed.

Preferably, the pin-shaped connectors further comprise support bodies for integrally fixing the connection pins.

The connection pins are preferably formed of one selected from the group consisting of Fe/Ni/Cu alloys and solder-plated hard wires.

The bodies are preferably formed of one selected from the group consisting of ceramic-, polyester-, polyimide-, and epoxy-based materials, which are insulation materials.

Preferably, the stack package further comprises a heat sink on either side of the stack package, such that it emits heat from the stack package.

In another aspect, the present invention provides a method for manufacturing a stack package comprising at least two CSP packages stacked on each other, which comprises the steps of: providing previously fabricated CSP packages; providing panels having an area for mounting the CSP packages, in which the panels comprise circuit patterns for electrical connection to the CSP package, which are formed at portions corresponding to the CSP package to be mounted, and the panels have first openings which are disposed at a region where the CSP packages are not mounted, in which the first openings are electrically connected to the circuit pattern; providing pin-shaped connectors which are inserted through the first openings of the panels and electrically connects the stacked panels to each other; mounting the CSP packages on the circuit pattern of the panels such that the CSP packages are electrically connected to the circuit pattern; stacking the panels having the CSP package mounted thereon, on each other in at least two layers, in such a manner that the first openings of one panel correspond to the first openings of the other panels; and inserting the pin-shaped connectors through the first openings corresponded to each other, such that the connectors are electrically connected to the circuit patterns of the stacked panels.

Preferably, the inventive method further comprises stacking a heat sink for easily emitting heat, at the step of stacking the panels.

Preferably, the inventive method further comprises the step of forming input/output terminals for inputting/outputting a signal to the outside on the lower surface of the stack package, the input/output terminals being formed of solder balls.

Preferably, the inventive method further comprises the step of protruding the connectors from the lower surface of the stack package and subjecting the protrusions to a solder dipping process, thereby forming input/output terminals for inputting/outputting a signal to the outside on the lower surface of the stack package.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 5a to 5c are drawings illustrating various examples of connectors for use in the stack package according to the present invention;

FIG. 6 is a drawing illustrating an example of a heat sink for use in the stack package according to the present invention;

DETAILED DESCRIPTION OF THE PREFERRED EMBODIMENT

Figure 1:
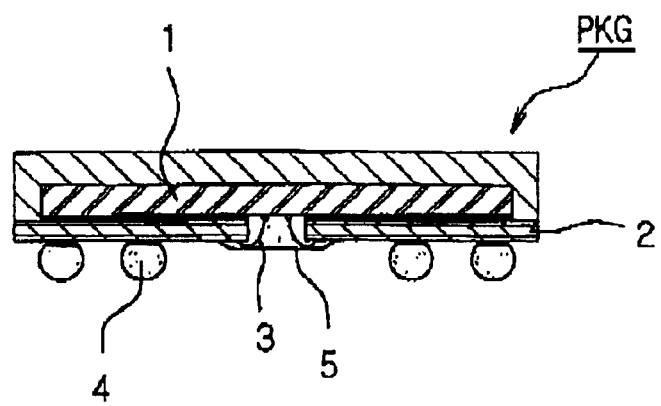
FIG. 1 is a drawing illustrating the general structure of an FBGA package.
Figure 2:
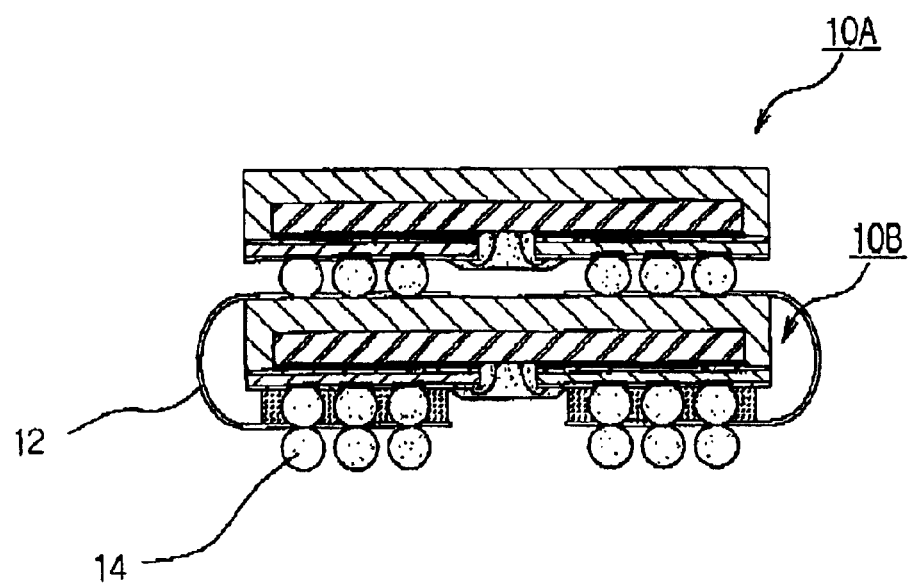
FIG. 2 is a drawing illustrating an example of prior stack packages which utilize FBGA of FIG. 1.
Figure 3:
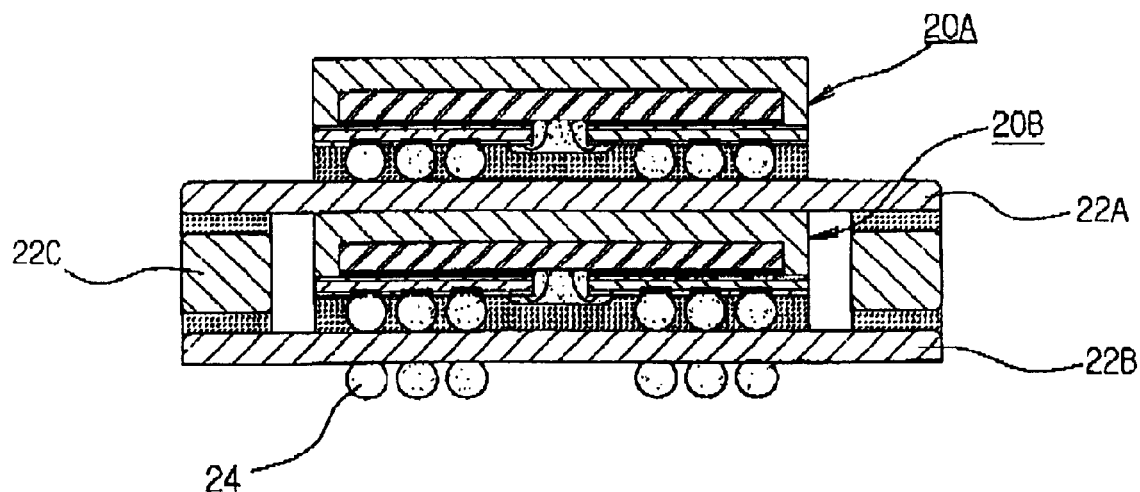
FIG. 3 is a drawing illustrating another example of prior stack packages which utilize FBGA of FIG. 1.

Reference will now be made in detail to the preferred embodiments of the present invention, examples of which are illustrated in the accompanying drawings.

In the description of the following embodiment, the same reference numerals as in the previous description for the FBGA package are used to indicate the elements of the FBGA package.

FIGS. 4a to 4e are drawings showing various examples of panels for use in the production of the stack package according to the present invention.

In order to embody the stack package according to the present invention, panels 100A to 100E shown in FIGS. 4a to 4e are used. Such panels 100A to 100E are used to stack at least two previously fabricated CSP packages PKG on each other. Various examples of the panels 100A to 100E will now be described with reference to FIGS. 4a to 4e.

Figure 4A:
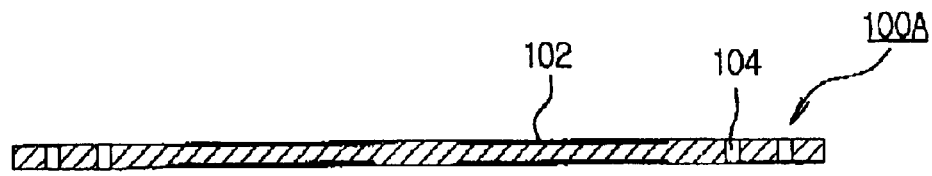
FIGS. 4a to 4e are drawings illustrating various examples of panels for use in the structure of a stack package according to the present invention.

The panel 100A shown in FIG. 4a has a circuit pattern 102 which is formed on the upper surface thereof so as to be electrically connected to a previously fabricated CSP package PKG mounted on the central portion of the upper surface of the panel 100A. Also, the panel 100A has first openings 104 which are located at a region where the CSP package PKG is not mounted, so that the first openings 104 are electrically connected to the circuit pattern. The first openings 104 are preferably formed at the outer portion of the panel 100A.

Figure 4B:
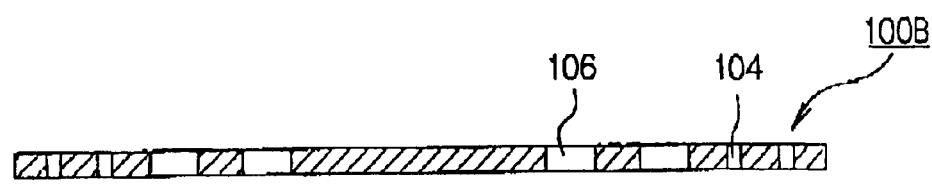

In a panel 100A shown in FIG. 4b, second openings 106 are additionally formed at positions corresponding to the first solder balls 4 of the CSP package PKG in the panel 100A of FIG. 4a, such that the first solder balls 4 of the CSP package PKG are inserted into the second openings 106. In this case, the first solder balls of the CSP package PKG are inserted into the second openings 106, so that the height of the stack package can be reduced when embodying the stack package.

Figure 4C:
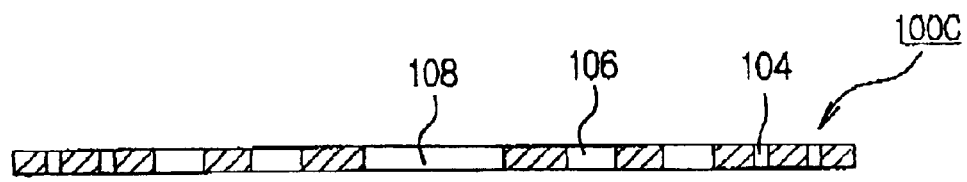

In a panel 100C shown in FIG. 4c, second openings 106 and a third opening 108 are additionally formed at positions corresponding to the first solder balls 4 and mold 5 of the CSP package PKG in the panel 100A of FIG. 4a, respectively, such that the first solder balls 4 and the mold 5 are inserted into the second openings 106 and the third opening 108, respectively. The insertion of the first solder balls 4 and the mold 5 into the second openings 106 and the third opening 108 allows the height of the stack package to be reduced as compared to the panel 100B of FIG. 4b when embodying the stack package.

Figure 4D:
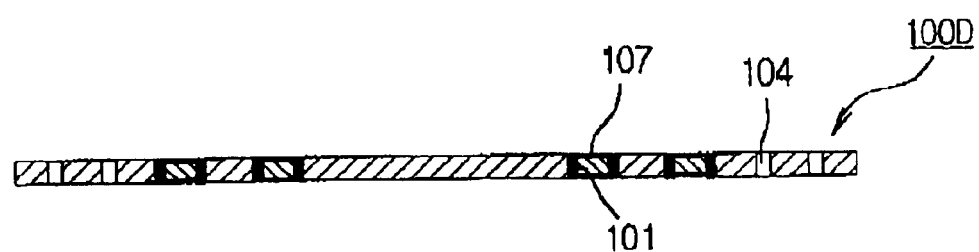

In a panel 100D as shown in FIG. 4d, holes are formed at positions corresponding to the first solder balls 4 of the CSP package PKG, and signal lines 101 are electrically connected to the holes. Then, the holes are filled up in such a manner that bonding pads 107 are exposed. Thus, the first solder balls 4 of the CSP package PKG are surface-mounted on the bonding pads 107, and signal lines are connected at a short length by the signal lines 107 disposed through the holes.

Figure 4E:
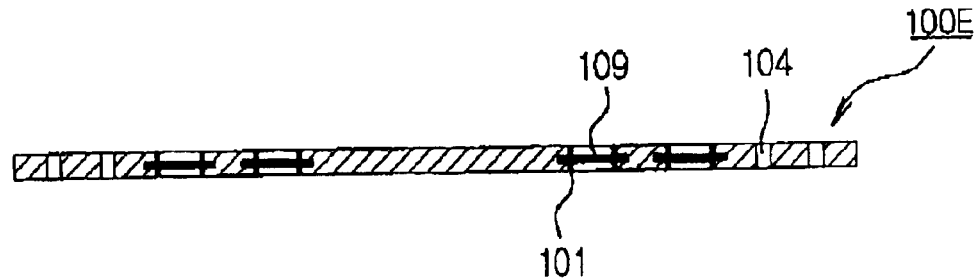

In a panel 100E as shown in FIG. 4e, holes are formed at positions corresponding to the first solder balls 4 of the CSP package CSP, and signal lines 101 are electrically connected to the holes. Then, the holes are filled up in such a manner that metals 109 are exposed at both surfaces. Thus, the signal lines are reduced, and input/output terminals as described later can be fused to the lower surface of the panel 100E.

FIGS. 5a to 5c are drawings showing various examples of connectors for use in the stack package according to the present invention.

As shown in FIGS. 5a to 5c, connectors 200A, 200B and 200C are used in order to embody the stack package according to the present invention. These connectors 200A, 200B and 200C serve to electrically connect while stacking at least two of the panels 100A to 100E on which the CSP package CSP is mounted. The connectors have connection pins 204 which are inserted into the first openings 104. Also, they have a body 202 for fixedly supporting the connection pins 204.

The connectors 200A, 200B and 200C are electrically connected to the circuit patterns of the panels 100A to 100E by stacking the panels 100A to 100E having the CSP package mounted thereon, in more than two layers, in such a manner that the first openings 104 of one panel correspond to the first openings of the other panels, and then inserting the connection pins 204 of the connector 200A, 200B and 200C into the corresponded openings 104 of the stacked panels 100A to 100E.

These connectors 200A, 200B and 200C comprise the body 202 which is preferably made of any one selected from the group consisting of ceramic-, polyester-, polyimide-, and epoxy-based materials, that are insulation materials. These materials make heat emission easy.

Moreover, the connection pins 204 are made of any one selected from the group consisting of Fe/Ni/Cu alloys and solder-plated hard wires. These connection pins 204 are inserted into the first openings 104 such that solders plated on the outer circumference of the connection pins 204 is in contact with the inner circumference of the first openings by a reflow process.

Various examples of the connectors 200A, 200B and 200C will now be described with reference to FIGS. 5a to 5C.

In the connector 200A shown in FIG. 5a, the connection pins 204 are extended from the upper surface of the body 202 upward and from the lower surface of the body 202 downward. In the connector 200B shown in FIG. 5b, the connection pins 204 are extended only from the lower surface of the body 202 downward. In the connector 200C shown in FIG. 5c, the connection pins 204 are extended from the upper surface of the body 202 upward and from the lower surface of the body 202 downward, in such a manner that the upwardly extended connection pins have a longer length than the downwardly extended connection pins. Of course, the connection pins 204 may be formed in such a manner that the downwardly extended connection pins have a longer length than the upwardly extended connection pins.

FIG. 6 is a drawing illustrating a heat sink for use in the stack package according to the present invention.

In order to embody the stack package according to the present invention, a heat sink 300 shown in FIG. 6 can be further included. The heat sink 300 is stacked on the stack package formed by stacking the CSP packages PKG on top of each other, so that it allows emission of heat from the package. It is made of a material having good heat conduction efficiency.

In this heat sink 300, openings 302 are formed at positions corresponding to the first openings 104 formed in the panels 100A to 100E, such that the connection pins 204 of the connectors 200A, 200B and 200C can be inserted into the openings 302.

FIGS. 7a to 7e are drawings illustrating a state where the CSP packages are mounted on the respective panels of FIGS. 4a to 4e.

Figure 7A:
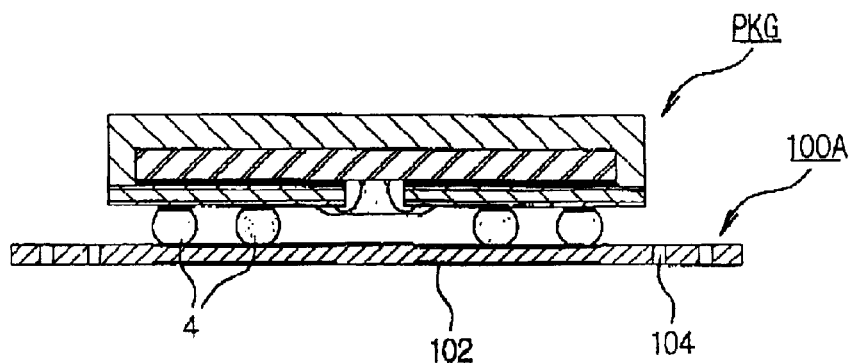
FIGS. 7a to 7e are drawings illustrating a state where the CSP packages are mounted on the panels shown in FIGS. 4a to 4e, respectively.

FIGS. 7a to 7e show a state where the previously fabricated CSP packages PKG are mounted on the respective panels 100A to 100E. More particularly, FIG. 7a shows a state where the previously fabricated CSP package PKG is mounted on the panel 100A according to FIG. 4a.

Figure 7B:
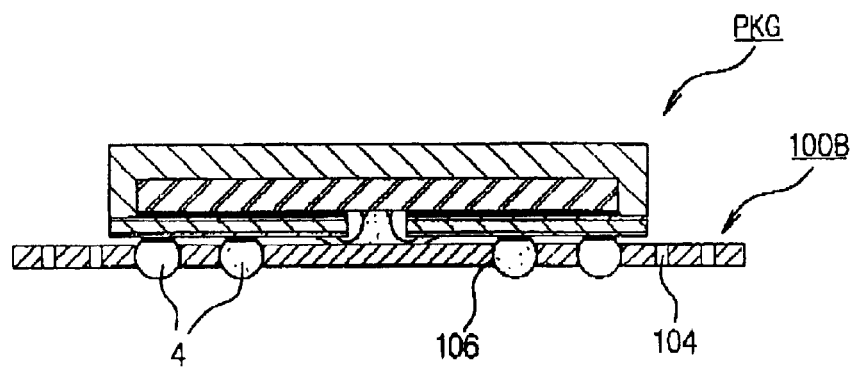

FIG. 7b shows a state where the previously fabricated CSP package PKG is mounted on the panel 100B according to FIG. 4b. In this case, the first solder balls 4 of the CSP package PKG are inserted into the second openings 106 formed in the panel 100B, so that the height of the stack package can be reduced.

Figure 7C:
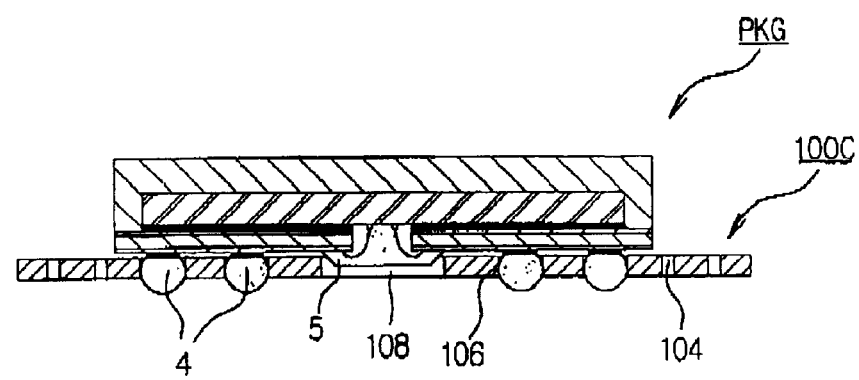

FIG. 7c shows a state where the previously fabricated CSP package PKG is mounted on the panel 100C according to FIG. 4c. In this case, the first solder balls 4 and mold 5 of the CSP package PKG are inserted into the second openings 106 and third opening 108 formed in the panel 100C, respectively, so that the height of the stack package can be reduced as compared to the structure of FIG. 7b.

Figure 7D:
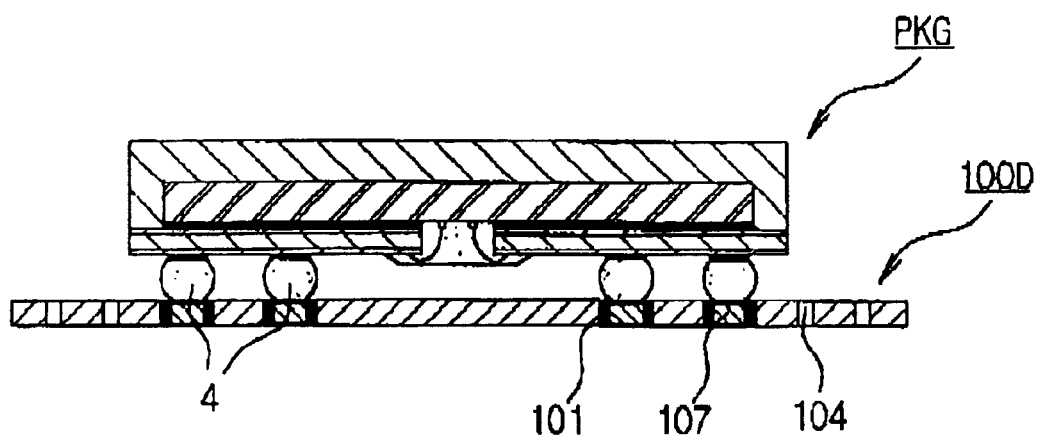

FIG. 7d shows a state where the previously fabricated CSP package PKG is mounted on the panel 100D according to FIG. 4d. This allows reduction of the length of electrical signal lines. In this case, plated holes are formed at bonding pads 107 adhered to the first solder balls 4 of the CSP package PKG, the holes are filled up, and electrical signal lines are formed at the upper and lower portions of the filled holes. Thus, the signal lines 107 at the upper portion of the filled holes can be formed to have the shortest length.

Figure 7E:
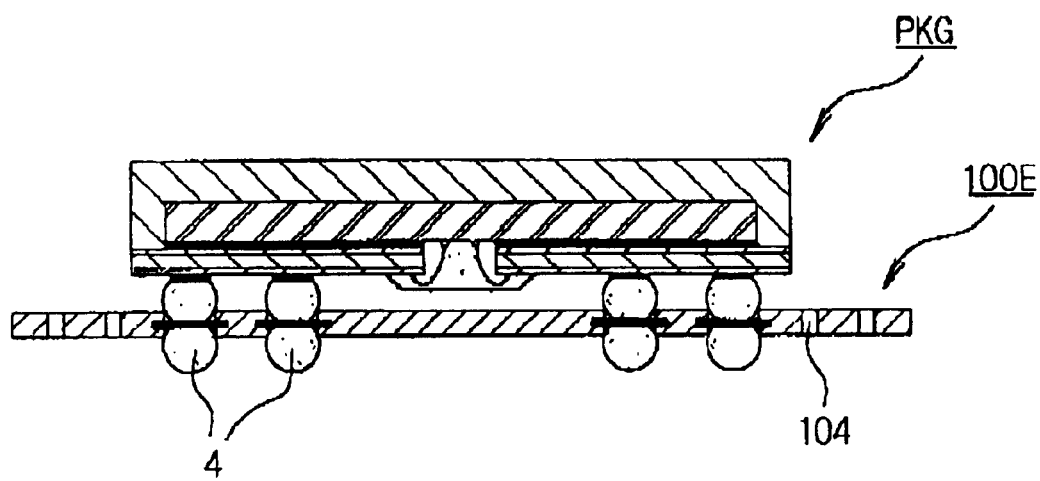

FIG. 7e shows a state where the previously fabricated CSP package PKG is mounted on the panel 100E according to FIG. 4e. In this case, input/output terminals 400 can be disposed at the lower portion of the panel 100E. This allows reduction of the length of the signal lines 101 and also the height of the stack package.

FIGS. 8a to 8e respectively show first to fifth embodiments of the stack packages according to the present invention, in which the packages shown in FIGS. 7a to 7e are stacked in combination with each other.

Figure 8A:
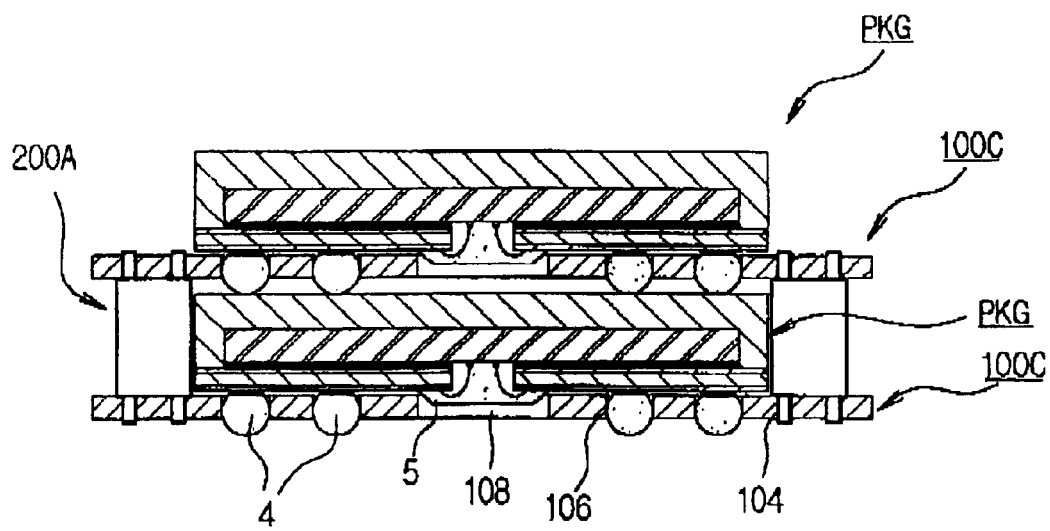
FIGS. 8a to 8e are the cross-sectional views of the stack packages according to first to fifth examples of the present invention, which show that the packages of FIGS. 7a to 72 are stacked in combination with each other.

In the stack package according to the first embodiment of FIG. 8a, two packages according to FIG. 7c are stacked in combination with each other, and the first solder balls 4 of the CSP package PKG, which protrude from the lower surface of the lower panel 100C, are used as input/output terminals.

Figure 8B:
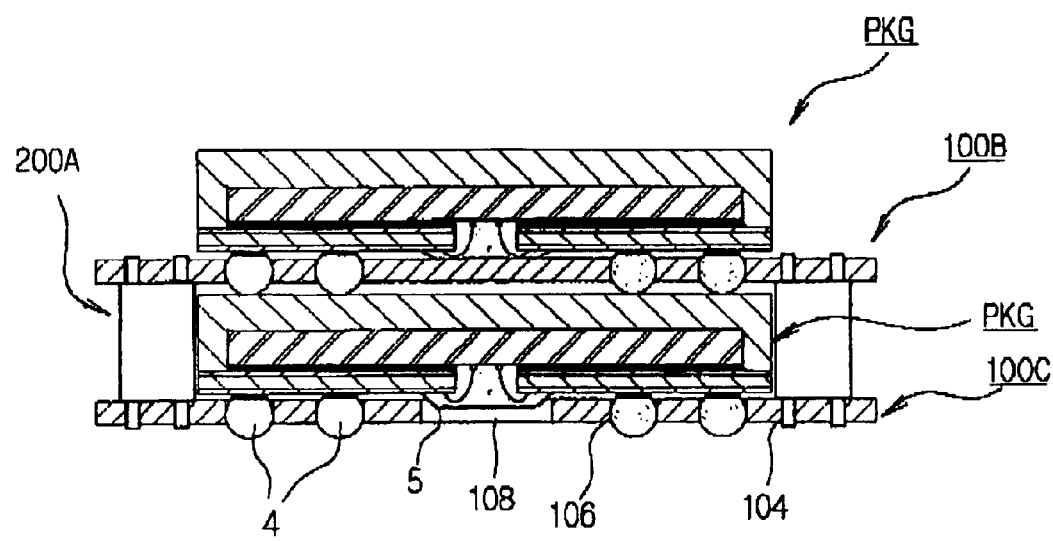

In the stack package according to the second embodiment of FIG. 8b, the package according to FIG. 7b and the package according to FIG. 7c are stacked in combination, and the first solder balls 4 of the CSP package PKG, which protrude from the lower surface of the lower panel 100C, are used as input/output terminals.

Figure 8C:
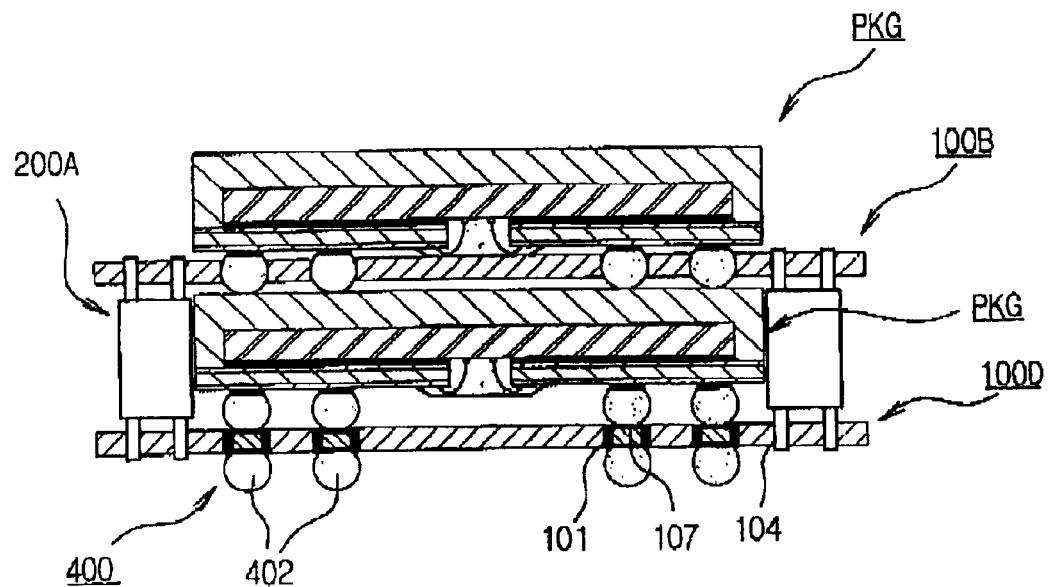

In the stack package according to the third embodiment of FIG. 8c, the package according to FIG. 7b and the package according to FIG. 7d are stacked in combination, and an input/output terminal 400 for transmitting a signal to the outside is provided on the lower surface of the lower panel 100D. The input/output terminal 400 serves to transmit a signal from the CSP package PKG stacked by the panels and the connector 200A to the outside. Second solder balls 402 are preferably fused to the lower surface of the panel 100D located at the lowest portion of the stacked panels.

Figure 8D:
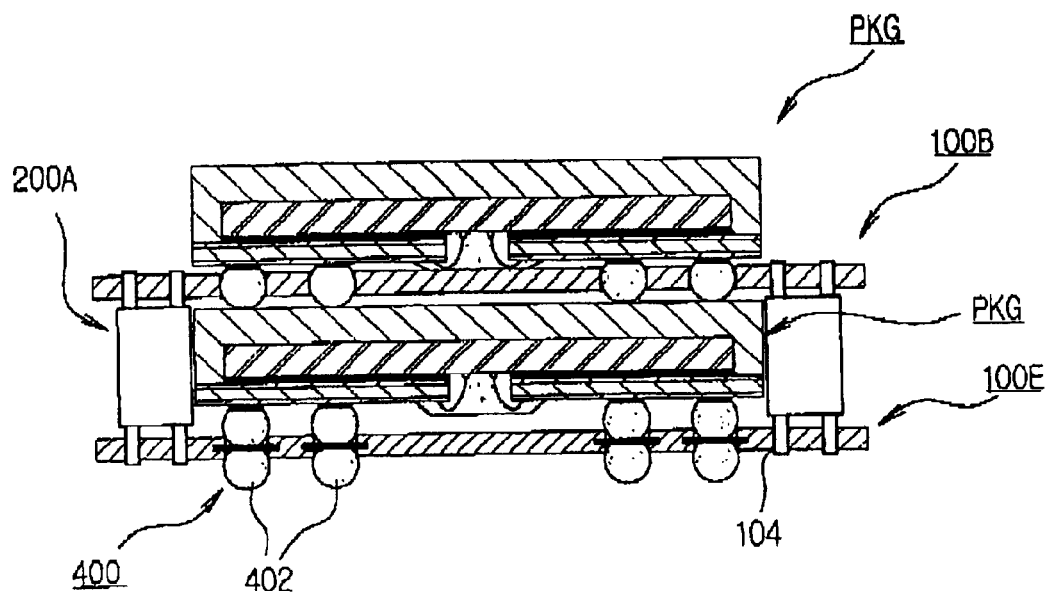

In the stack package according to the fourth embodiment of FIG. 8d, the package according to FIG. 7b and the package according to FIG. 7e are stacked in combination, and the input/output terminal 400 for transmitting a signal to the outside is also provided on the lower surface of the lower panel 100E.

Figure 8E:
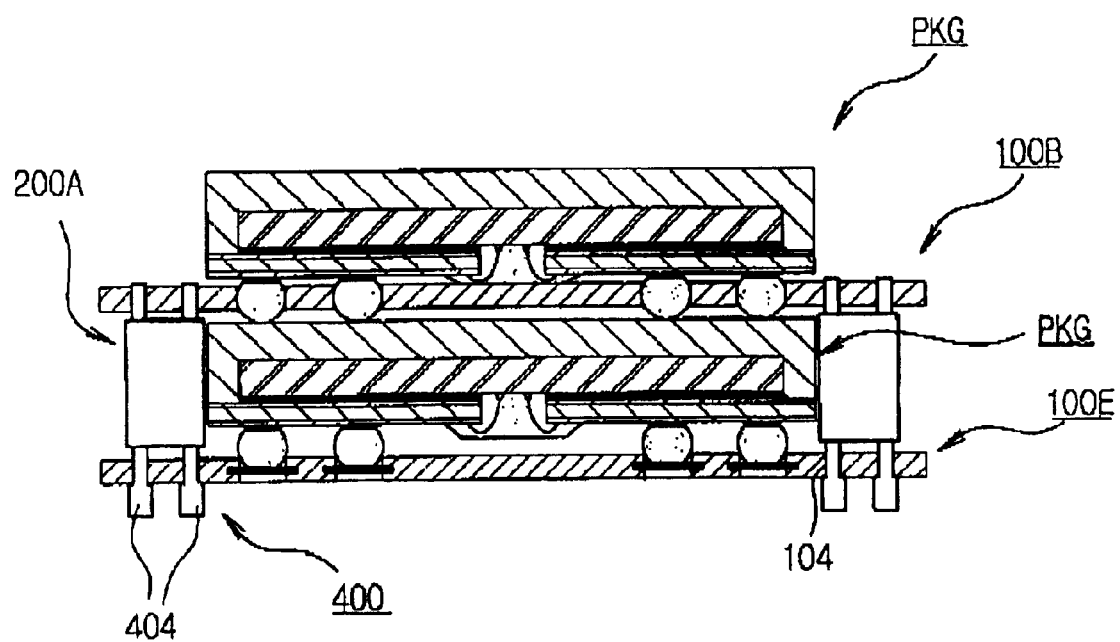
Figure 9A:
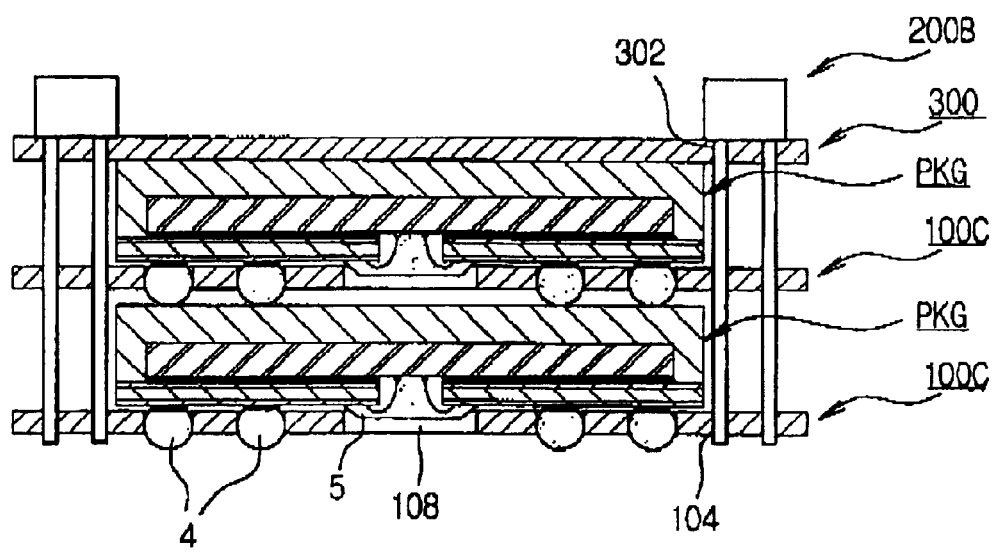
FIGS. 9a to 9f are cross-sectional views of stack packages according to sixth to eleventh examples of the present invention, which show a structure where a heat sink is mounted by stacking.
Figure 9B:
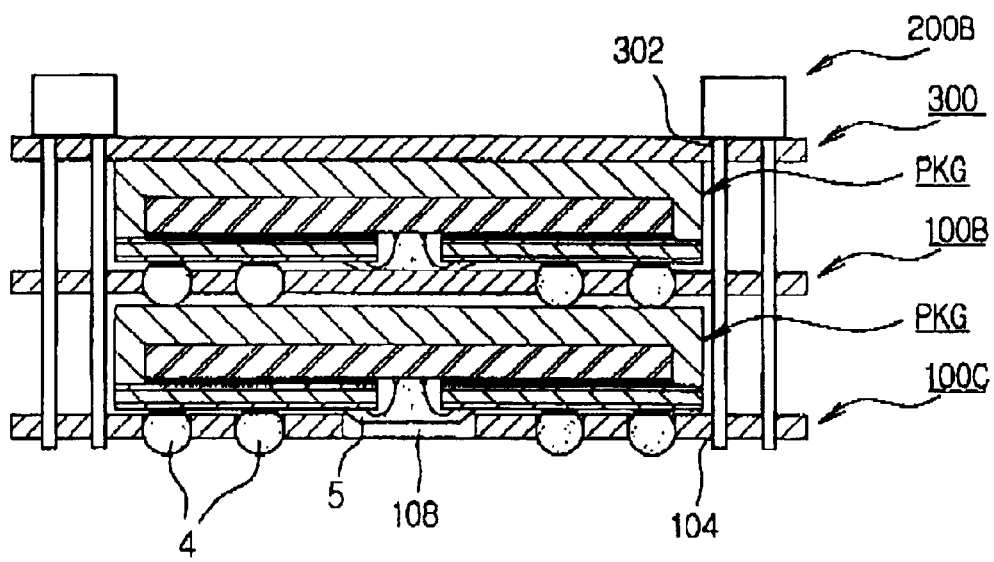
Figure 9C:
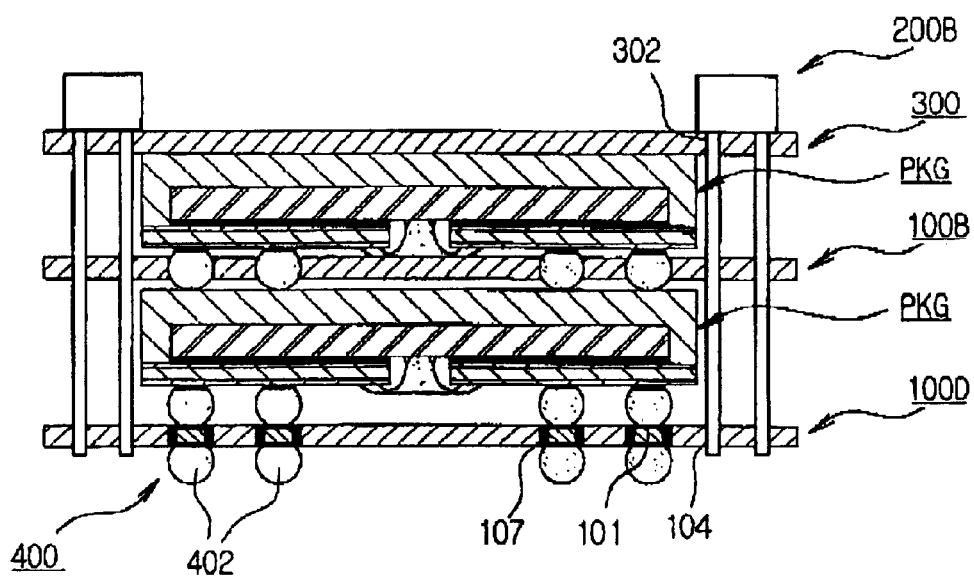
Figure 9D:
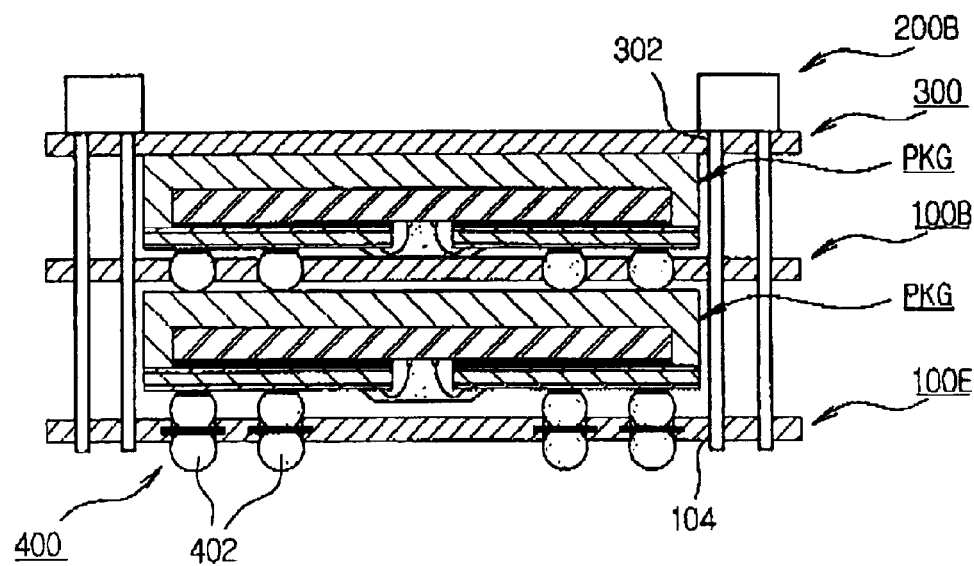
Figure 9E:
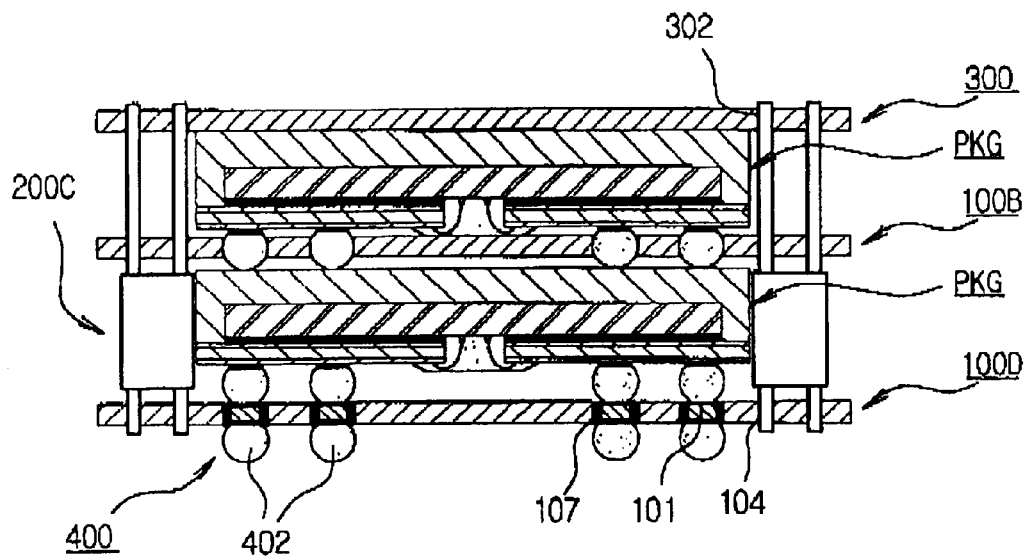
Figure 9F:
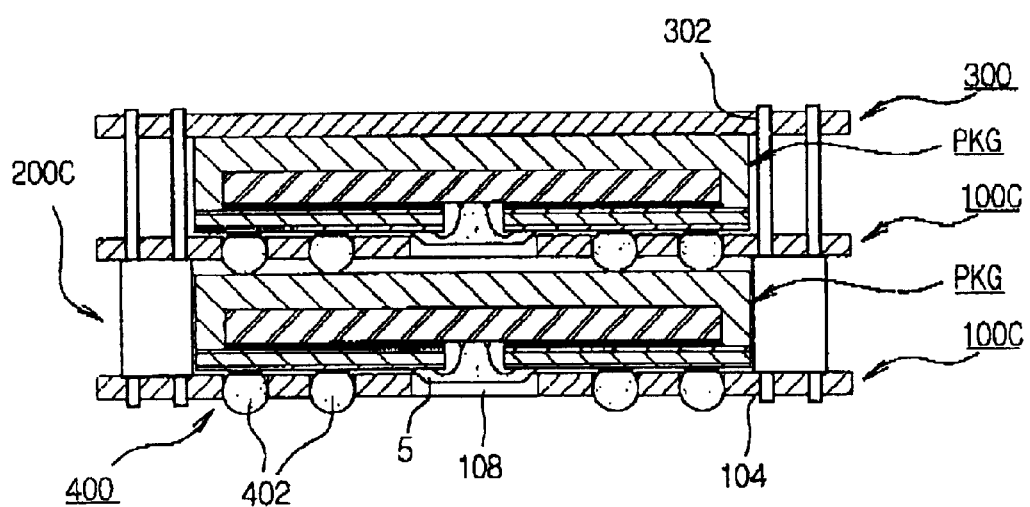

In the stack package according to the fifth embodiment of FIG. 8e, the package according to FIG. 7b and the package according to FIG. 7e are stacked in combination, and another example of the input/output terminal 400 is applied. This input/output terminal 400 consists of the connection pins 204 of the connector 200A, which protrude from the lower surface of the panel 100E located at the lowest portion of the stacked panels. The proportions are subjected to a solder dipping process.

FIGS. 9a to 9e are cross-sectional views of the stack packages according to sixth to eleventh embodiments of the present invention, which show structures where a heat sink is stacked.

In the stack packages according to the sixth to eleventh embodiments as shown in FIGS. 9a to 9f, the heat sink 300 shown in FIG. 6 is stacked together when stacking the packages of FIGS. 7a to 7e in combination, and the connectors shown in FIGS. 5b and 5c are used. The detailed description of the stack packages according to the sixth to eleventh embodiments are omitted in order to avoid the repeated description, since these stack packages are for the cases where the heat sink 300 is additionally stacked when stacking the packages of FIGS. 7a to 7e as described above.

In a method of manufacturing the stack package according to the present invention as described above, at least two CSP packages PKG which were previously fabricated are provided (see, FIG. 1).

Moreover, the CSP packages PKG are mounted, on which circuit patterns 102 for electrical connection are formed. The panels 100A to 100E having the first openings 104, which are formed so as to be electrically connected to the circuit patterns 102, are provided at a region where the CSP packages PKG are not mounted (see, FIGS. 4a to 4e).

Furthermore, at least two of the panels 100A to 100E are stacked such a manner that the first openings 104 of one panel correspond to the first openings 104 of the other panels. The connectors 200A, 200B and 200C are then provided, which have the connection pins 204 which are inserted into the first openings 104 formed in the panels 100A to 100E to electrically connect the panels to each other (see, FIGS. 5a to 5c).

On the central portion of the upper surface of the panels 100A to 100E provided as described above, the CSP packages PKG are mounted, such that they are electrically connected to the circuit patterns formed on the panels 100A to 100E (see, FIGS. 7a to 7e).

As described above, the stack package according to the present invention is manufactured by stacking at least two of the panels 100A to 100E having the respective CSP packages mounted thereon, in combination with each other, in such a manner that the first openings 104 of one panel correspond to the first openings 104 of other panels. In this case, the panels 100A to 100E are stacked in such a manner that the first openings 104 are located on the same vertical line. The connection pins 204 of the connectors 200A, 200B and 200C are inserted through the first openings 104 of the stacked panels 100A to 100E, and subjected to a reflow process, such that the stacked CSP packages are electrically connected to each other. In this case, the connection pins 204 are plated with solders, so that they are electrically connected through the plated portions by the reflow process (see, FIGS. 8a and 8B).

Furthermore, the inventive method comprises the step of forming the input/output terminals 400 for transmitting a signal from the CSP packages PKG to the outside. The input/output terminals 400 may be formed by reflow of the second solder balls 402 on the lower surface of the panel located at the lowest portion of the stacked panels 100A to 100E (see, FIGS. 8c and 8d). In addition, the input/output terminals 400 may be formed by protruding the lower end of the connection pins 204 of the connectors 200A, 200B or 200C from the lower portion of the panel located the lowest portion of the stacked panels, and subjecting the protrusions 404 to a solder dipping process (see, FIG. 8e).

Moreover, according to the present invention, the heat sink 300 may be stacked together when stacking the CSP packages PKG. This heat sink 300 allows more efficient emission of heat generated from the stack package, thereby improving performance of the stack package (see, FIGS. 9a to 9f).

As apparent from the foregoing, the present invention has an advantage in that the polyimide film is not used so that production cost can be reduced. Also, the outer portion of the stack package is soldered so that the stack package is easily manufactured. Moreover, since the length of signal lines in the stack package becomes short, electrical properties of the stack package are improved. Furthermore, since the attached portions of the stack package can be observed with the naked eye in the outside, the stack package can be easily examined.

Also, the present invention is advantageous in that, since the second openings into which the first solder balls of the CSP packages are inserted are formed in the panels on which the previously fabricated CSP packages are mounted, the total thickness of the stack package becomes thin and the length of the signal lines becomes short, so that the stack package is suitable for high-speed applications. Moreover, since the connectors and the heat sink are easily combined and fabricated, the stack package has inexpensive costs, and is easy to emit heat so that it is suitable for high-speed applications. In addition, the present invention can easily cope with various types of stack packages.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. In a stack package having CSP packages stacked on each other, in which the CSP packages comprise a substrate for mounting a semiconductor chip, in which the substrate has first solder balls for inputting/outputting a signal from the semiconductor chip, and a mold for protecting the semiconductor chip, the improvement comprising:
   panels having an area for mounting the respective CSP packages, in which the panels comprise circuit patterns for electrical connection to the CSP packages, which are formed at portions of the panels corresponding to the CSP packages to be mounted, and the panels have first openings for electrical connection to the circuit patterns, which are formed at both sides of the circuit patterns; and
   bi-directional male connectors, each having a connector body and an array of pins extending on opposite sides from said connector body, which are inserted through the first openings of the panels which are stacked in at least two layers in such a manner that the first openings of one panel correspond to the first openings of the other panels, so that the connectors are electrically connected to the circuit patterns of the stacked panels via said array of pins on said opposite sides of each said connector body of said male connectors.

2. The stack package of claim 1, which further comprises input/output means for inputting/outputting a signal from the semiconductor chip, in which the input/output means are formed on the lower surface.

3. The stack package of claim 2, in which the input/output means are second solder balls which are formed on the lower surface of the panels so as to be connected to the circuit patterns.

4. The stack package of claim 2, in which the input/output means are protrusions protruding from the lower surface of the pin-shaped connectors, in which the protrusions are subjected a solder dipping process.

5. A stack package having CSP packages stacked on each other, in which the CSP packages comprise a substrate for mounting a semiconductor chip, in which the substrate has first solder balls for inputting/outputting a signal from the semiconductor chip, and a mold for protecting the semiconductor chip, the stack package comprising:
   panels having an area for mounting the respective CSP packages, in which the panels comprise circuit patterns for electrical connection to the CSP packages, which are formed at portions of the panels corresponding to the CSP packages to be mounted, and the panels have first openings for electrical connection to the circuit patterns, which are formed at both sides of the circuit patterns;
   pin-shaped connectors which are inserted through the first openings of the panels which are stacked in at least two layers in such a manner that the first openings of one panel correspond to the first openings of the other panels, so that the connectors are electrically connected to the circuit patterns of the stacked panels; and
   second openings which are formed at the surface of the panel corresponding to the first solder balls, such that the first solder balls are inserted into the second openings.

6. A stack package having CSP packages stacked on each other, in which the CSP packages comprise a substrate for mounting a semiconductor chip, in which the substrate has first solder balls for inputting/outputting a signal from the semiconductor chin, and a mold for protecting the semiconductor chip, the stack package comprising:
   panels having an area for mounting the respective CSP packages, in which the panels comprise circuit patterns for electrical connection to the CSP packages, which are formed at portions of the panels corresponding to the CSP packages to be mounted, and the panels have first openings for electrical connection to the circuit patterns, which are formed at both sides of the circuit patterns;
   pin-shaped connectors which are inserted through the first openings of the panels which are stacked in at least two layers in such a manner that the first openings of one panel correspond to the first openings of the other panels, so that the connectors are electrically connected to the circuit patterns of the stacked panels; and
   a third opening which is formed at the surface of the panel corresponding to the mold, such that the mold is inserted into the third opening.

7. The stack package of claim 1, which further comprises bonding pads which are formed at the surface of the panel corresponding to the first solder balls such that the bonding pad are connected to the circuit patterns of the panels.

8. A stack package having CSP packages stacked on each other, in which the CSP packages comprise a substrate for mounting a semiconductor chip, in which the substrate has first solder balls for inputting/outputting a signal from the semiconductor chip, and a mold for protecting the semiconductor chip, the stack package comprising:
   panels having an area for mounting the respective CSP packages, in which the panels comprise circuit patterns for electrical connection to the CSP packages, which are formed at portions of the panels corresponding to the CSP packages to be mounted, and the panels have first openings for electrical connection to the circuit patterns, which are formed at both sides of the circuit patterns;
   pin-shaped connectors which are inserted through the first openings of the panels which are stacked in at least two layers in such a manner that the first openings of one panel correspond to the first openings of the other panels, so that the connectors are electrically connected to the circuit patterns of the stacked panels; and bonding pads which are formed at the surface of the panel corresponding to the first solder balls such that the bonding pads are connected to the circuit patterns of the panels;

wherein the bonding pads comprise signal lines disposed so as to be connected to the circuit patterns via through-holes of the panel, and watertight films which watertightly seal the through holes in which the signal lines are disposed.

9. The stack package of claim 1, in which the pin-shaped connectors further comprise support bodies for integrally fixing the connection pins.

10. The stack package of claim 9, in which the connection pins are formed of one selected from the group consisting of Fe/Ni/Cu alloys and solder-plated hard wires.

11. The stack package of claim 9, in which the bodies are formed of one selected from the group consisting of ceramic-, polyester-, polyimide-, and epoxy-based materials, that are insulation materials.

12. The stack package of claim 1, which further comprises a heat sink on either side of the stack package such that it emits heat from the stack package.

13. A stack package comprising:
an upper panel having opposite top and bottom surfaces comprising:
first soldering pads at a middle area of the top surface; and
a through hole array at a peripheral area of the panel; and
wherein each hole has a soldering pad electrically connected to the first soldering pads in the top surface;
a lower panel having opposite top and bottom surfaces comprising:
first soldering pads at a middle area of the top surface; and
a through hole array at a peripheral area of panel; and
wherein each hole has a soldering pad electrically connected to the first and/or second soldering pads on the bottom surface;
at least two bi-directional male connectors comprising:
a supporting body having opposite top and bottom sides; and
an array of pins fixed by the supporting body; and both ends of each pin extend beyond the surfaces of the supporting body; and
at least two IC packages having input/output terminals on the bottom surface;
wherein each IC chip is mounted on the middle area of the top surface of the upper and lower panels and input/output terminals are electrically connected to each corresponding first soldering pads, and top side pins of the male connectors are inserted from the bottom surface to the top surface and extending beyond the pad of corresponding holes arrayed at the peripheral area of the top panel;
wherein bottom side pins of male connectors are inserted from the top surface to the bottom surface and extending beyond the pads of corresponding holes arrayed at the peripheral area of the bottom panel, and
wherein the supporting body of the male connector is disposed between the upper and lower panels and keeps a uniform space between the upper and lower panels.

14. The stack package of claim 13, further comprising:
solder balls which are formed on the pads at the middle area on the bottom surface of the lower panel.

15. The stack package of claim 13, further comprising:
an electrical connection by soldering a part of pins extended beyond the pads and the pads of holes are arrayed at the side of upper and lower panels.

16. The stack package of claim 13, wherein a protruded part at the middle area of pins inside the supporting body prevents missing of pins from the supporting body.

17. The stack package of claim 13, wherein the supporting body is fabricated from non-conductive materials.

18. The stack package of claim 13, wherein the pins of the male connectors are formed of one elected form the group consisting of Fe/Ni/Cu/Au alloys and solder-plated hard wires.

19. The stack package of claim 13, further comprising:
second openings which are formed at the surface of the panel corresponding to the first solder balls, such that the first solder balls are inserted into the second openings.

20. The stack package of claim 13, further comprising:
a third opening which is formed at the surface of the panel corresponding to the mold, such that the mold is inserted into the third opening.

21. The stack package of claim 13, further comprising:
bonding pads which are formed at the surface of the panel corresponding to the first solder balls such that the bonding pads are connected to the circuit patterns of the panels;
wherein the bonding pads comprise signal lines disposed so as to be connected to the circuit patterns via through-holes of the panel, and watertight films which watertightly seal the through holes in which the signal lines are disposed.

22. A stack package comprising:
an upper panel having opposite top and bottom surfaces comprising:
a cavity from the bottom surface to the top surface at a center area;
first soldering pads surrounding the cavity on the bottom surface;
second pads electrically connected to the first soldering pad; and
a through hole array at a peripheral area of the panel;
wherein each hole has a soldering pad electrically connected to the second soldering pads on the top surface; and
a lower panel having opposite top and bottom surfaces comprising:
a cavity from the bottom surface to the top surface at a center area;
first soldering pads surrounding the cavity on the bottom surface; and
a through hole array at a peripheral area of the panel;
wherein each hole has a soldering pad electrically connected to the second soldering pads on the bottom surface;
at least two bi-directional male connectors comprising:
a supporting body having opposite top and bottom sides; and
an array of pins fixed by the supporting body; and wherein both ends of each pin extend beyond the surfaces of the supporting body; and
at least two IC chips having input/output terminals on the bottom surface;
wherein each IC chip is mounted on a middle area of the top surface of the upper and lower panels and input/ output terminals are electrically connected to each corresponding first soldering pads, and wherein top side pins of male connectors are inserted from the bottom surface to top surface and extend beyond the pads of corresponding holes arrayed at the peripheral area of top panel;

wherein bottom side pins of male connectors are inserted from the top surface to the bottom surface and extend beyond the pads of corresponding holes arrayed at the peripheral area of the bottom panel; and wherein a supporting body of the male connectors is disposed between the upper and lower panels and keeps a uniform space between the upper and lower panels.

* * * * *

UNITED STATES PATENT AND TRADEMARK OFFICE
CERTIFICATE OF CORRECTION

PATENT NO.        : 6,924,556 B2                                Page 1 of 1
APPLICATION NO. : 10/279977
DATED             : August 2, 2005
INVENTOR(S)       : Cha It is certified that error appears in the above-identified patent and that said Letters Patent is hereby corrected as shown below:

On the title page: Item [30] Foreign Priority Data, should read- REPUBLIC OF KOREA 2002-53891 09/06/2002

Signed and Sealed this

Twenty-second Day of August, 2006

JON W. DUDAS
*Director of the United States Patent and Trademark Office*